(12) United States Patent
Seigler et al.

(10) Patent No.: US 6,661,620 B2
(45) Date of Patent: Dec. 9, 2003

(54) DIFFERENTIAL CPP SENSOR

(75) Inventors: Michael Allen Seigler, Pittsburgh, PA (US); Gregory John Parker, Warrendale, PA (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/683,522

(22) Filed: Jan. 13, 2002

(65) Prior Publication Data

US 2002/0044389 A1 Apr. 18, 2002

Related U.S. Application Data

(60) Provisional application No. 60/315,413, filed on Aug. 28, 2001.

(51) Int. Cl.[7] ................................................. G11B 5/39
(52) U.S. Cl. ........................................ 360/314; 360/324
(58) Field of Search ................................ 360/314, 317, 360/324, 324.1, 324.12, 324.2

(56) References Cited

U.S. PATENT DOCUMENTS

| 4,907,114 | A | | 3/1990 | Shiiki et al. ............. 360/327.3 |
|---|---|---|---|---|
| 5,569,544 | A | | 10/1996 | Daughton .................... 428/611 |
| 5,668,688 | A | | 9/1997 | Dykes et al. ............. 360/324.1 |
| 5,729,410 | A | * | 3/1998 | Fontana et al. .......... 360/324.2 |
| 5,751,521 | A | | 5/1998 | Gill .............................. 360/314 |
| 6,011,674 | A | * | 1/2000 | Nakatani et al. ......... 360/324.2 |
| 6,128,160 | A | | 10/2000 | Yamamoto ............. 360/324.11 |
| 6,185,079 | B1 | * | 2/2001 | Gill ........................... 360/324.2 |
| 6,197,439 | B1 | | 3/2001 | Parkin et al. ................ 428/678 |
| 6,249,407 | B1 | * | 6/2001 | Aoshima et al. .......... 360/324.2 |
| 6,252,748 | B1 | * | 6/2001 | Yamanaka et al. .......... 360/317 |
| 6,259,586 | B1 | * | 7/2001 | Gill ........................... 360/324.2 |
| 6,278,593 | B1 | * | 8/2001 | Nakatani et al. ......... 360/324.2 |
| 6,307,708 | B1 | * | 10/2001 | Yoda et al. .................. 360/126 |
| 6,316,965 | B1 | * | 11/2001 | Jonker et al. ............... 326/134 |

* cited by examiner

*Primary Examiner*—Jefferson Evans
(74) *Attorney, Agent, or Firm*—Buchanan Ingersoll (57) ABSTRACT

A differential sensor for reading data from a magnetic medium is disclosed. The sensor comprises two GMR multilayer structures biased in opposite directions, such as to show the transitions between binary states recorded on the media as the media flows under the sensor. The biasing of the GMR structures can be accomplished using a synthetic-antiferromagnet.

26 Claims, 9 Drawing Sheets

DIFFERENTIAL CPP SENSOR

RELATED APPLICATIONS

Referenced-applications

This application claims the benefit of U.S. Provisional application Ser. No. 60/315,413, filed Aug. 28, 2001.

FIELD OF THE INVENTION

The invention relates to the field of the magnetic recording of data, and, in particular, to the recording of data on a magnetic disc. Specifically, this invention discloses a novel sensor for the reading of data from a magnetic disc.

BACKGROUND OF INVENTION

Devices utilizing the giant magneto-resistance (GMR) effect have utility as magnetic sensors, especially as read sensors in read heads used in magnetic disc storage systems. The GMR effect is observed in thin, electrically conductive multi-layer systems having multiple magnetic layers. One sensor type that utilizes the GMR effect is the GMR multilayer. The GMR multilayer typically comprise a series of bi-layer devices, each of which comprise a thin sheet of a ferromagnetic material and a thin sheet of a non-magnetic material. The bi-layers are stacked to form a multi-layer device. The magnetization of each ferromagnetic layer in the multi-layer device is approximately orthogonal to the magnetization of adjacent ferromagnetic layers and would be oriented in a plane perpendicular to the plane of the disc. The multi-layer device is typically mounted in the read head so that the magnetic axis of the ferromagnetic layers are transverse to the direction of rotation of the disc.

In operation, a sense current is caused to flow through the read head and therefore through the sensor. The magnetic flux from the disc causes a rotation of the magnetization vector in at least one of the sheets, which in turn causes a change in the overall resistance of the sensor. As the resistance of the sensor changes, the voltage across the sensor changes, thereby producing an output voltage.

Figure 1:
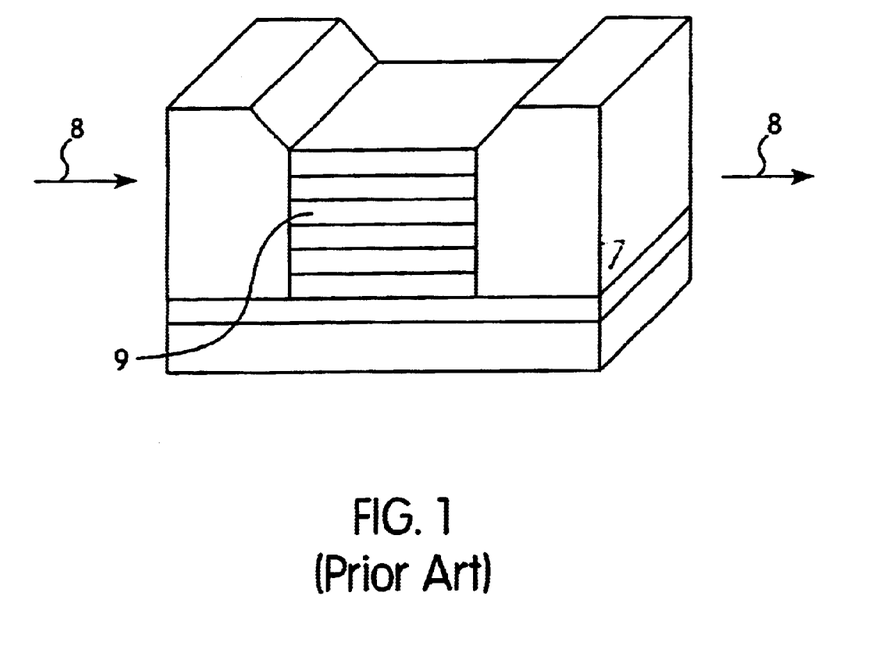
FIG. 1 shows a prior art CIP type sensor.

The output voltage produced by the sensor is affected by various characteristics of the sensor. The sense current can flow through the sensor in a direction that is parallel to the planes of the layers or stacked strips. This is known as a current-in-plane (CIP) configuration. This configuration is shown in FIG. 1, wherein the sense current is represented by arrow 8 and is shown flowing parallel to layers 9 of the sensor. Reference numbers 5, 6, and 7 show bottom shield, an insulating layer and permanent magnets, respectively. Typically, the types of sensors used today for the reading of magnetically recorded data can be categorized as current-in-plane sensors.

Figure 2:
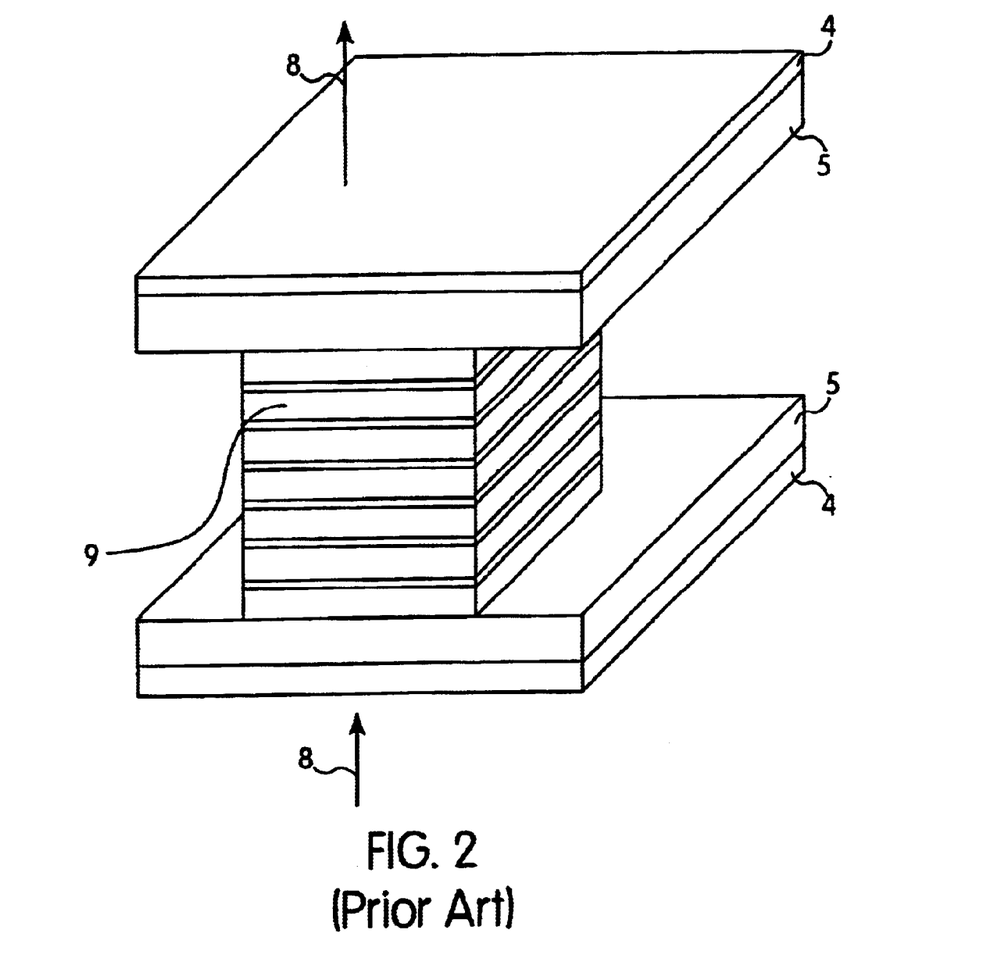
FIG. 2 shows a prior art CPP type sensor.

Alternatively, the sense current can flow through the sensor in a direction that is perpendicular to the planes of the layers or stacked strips that comprise the sensor. This configuration is known as a current-perpendicular-to-plane (CPP) configuration. A CPP sensor is shown schematically in FIG. 2, wherein the sense current is represented by arrow 8 and is shown flowing perpendicular to layers 9 of the sensor through shields 5 and non-magnetic electrical conducting layers 4.

The CPP sensor is interesting because of its potentially larger giant magneto-resistance (GMR) or change in resistance when a magnetic field is applied. The larger change in resistance comes about because all of the current needs to pass through every ferromagnetic/nonmagnetic/ferromagnetic (FM/NM/FM) series of interfaces and none of the current is shunted around the interfaces. Because every film and interface leads to additional resistance, it is desired to have all of the films and interfaces contribute to the overall $\Delta R$. One such sensor is a GMR multilayer, which consists of a series of FM/NM bi-layers. Every series of interfaces is an opportunity for interfacial spin-dependent scattering and every FM material is an opportunity for bulk spin-dependent scattering.

Figure 3:
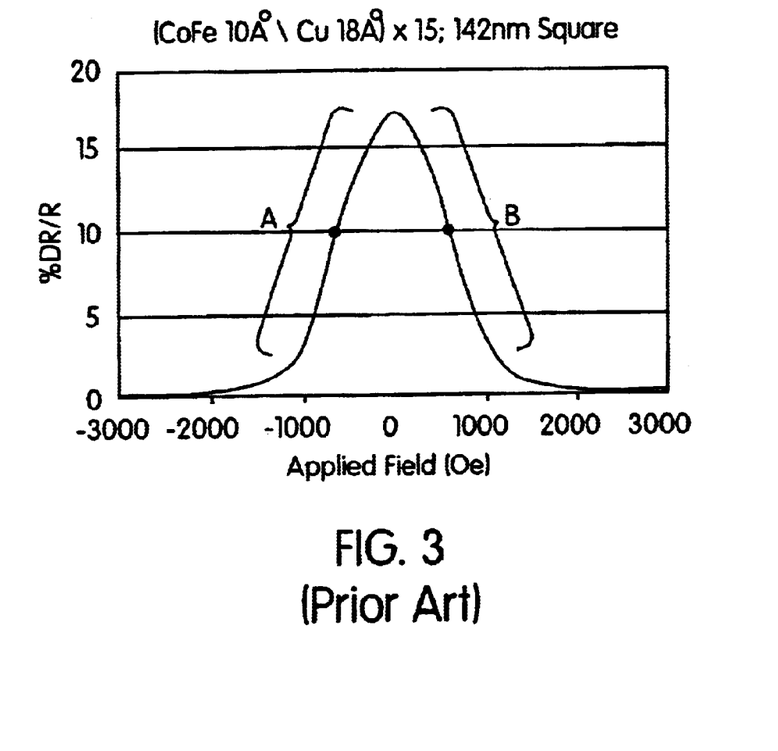
FIG. 3 shows the transfer curve from a CPP-GMR multilayer.

An example of a transfer curve from a CPP-GMR multilayer made of 15 bi-layers of (Cu 18 Å\CoFe 10 Å) is shown in FIG. 3. In the quiescent state, the magnetization of adjacent layers in this sample are oriented 180° with respect to each other, due to RKKY (Ruderman-Kittel-Kasuya-Yosida) coupling. The Cu thickness was chosen such that the RKKY coupling between the CoFe layers would be antiferromagnetic.

It can be seen from FIG. 3 that if this type of sensor is used in a magnetic recording head, it will need to be biased such that it operates in a linear region, denoted by A and B on the graph. This will be necessary to use detection and tracking schemes that depend on signal linearity. One way of biasing a GMR multilayer sensor is to place a permanent magnet (PM) nearby, such that the magnetizations of adjacent FM layers are approximately orthogonal to each other. This would be similar to applying a DC magnetic field of ~500 Oe to the sensor shown in FIG. 3. The sensor could then be used to sense the field from the magnetic recording media.

Figure 4:
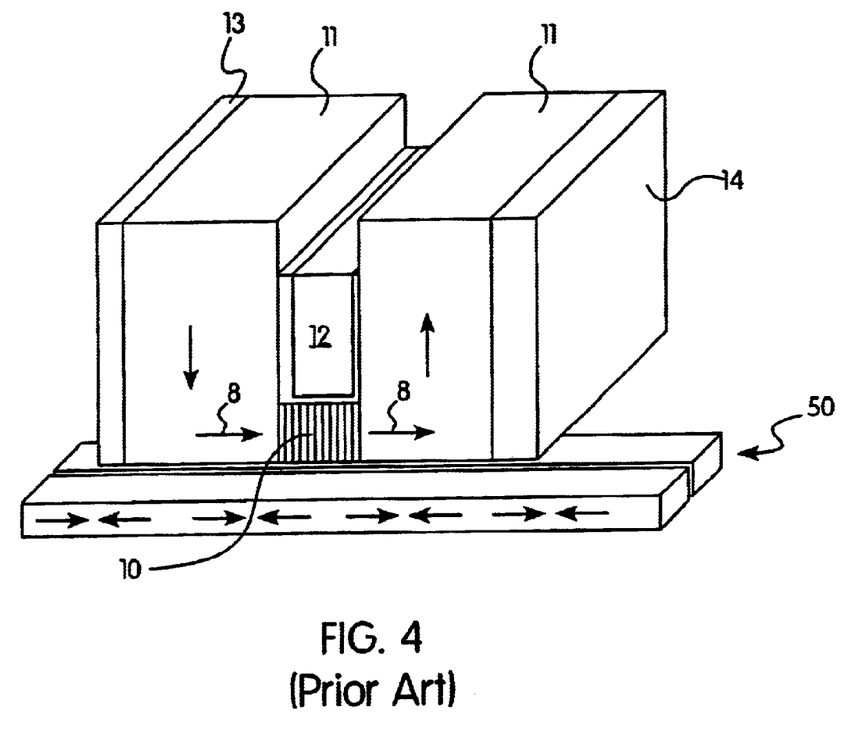
FIG. 4 is a schematic of a prior art CPP read head using a GMR multilayer as the sensing element and a permanent magnet for biasing.

FIG. 4 shows a schematic representation of one possible design for a CPP read head using a GMR multilayer 10 that is biased into the linear operating region using permanent magnet 12 and which uses shields 11 as the current carrying leads. Layers 13 and 14 are non-magnetic conductors.

Figure 5:
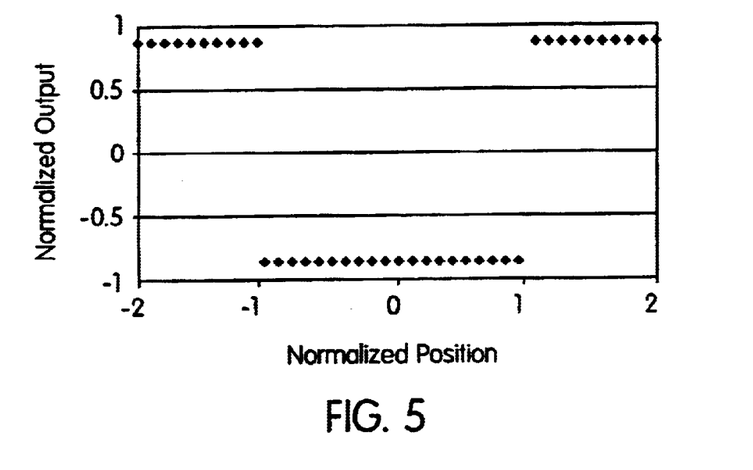
FIG. 5 shows the readback signal for the prior art CPP-GMR multilayer readback sensor of FIG. 4.

The transfer curve response that the head of FIG. 4 would have to perpendicular media may resemble a square wave similar to the diagram shown in FIG. 5. This type of response is difficult for a read back channel to handle due to the fact that it's impulse response contains DC components.

Figure 6:
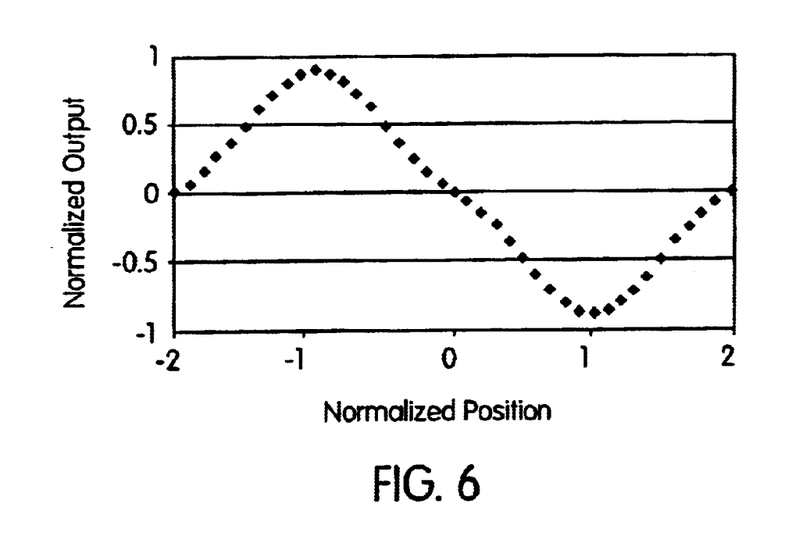
FIG. 6 shows the readback signal of the differential CPP sensor of the present invention.

One suggested solution to this problem is to differentiate the signal, which may result in a signal resembling that shown in FIG. 6. This would make the signal much more compatible with the read back channels used today. A problem with this solution is that the process of differentiating the signal may add high frequency noise to the read back signal.

It would therefore be desirable to provide a sensor which outputs a signal compatible with contemporary read back channels without the high frequency noise.

SUMMARY OF INVENTION

The solution disclosed herein is to make a head that effectively differentiates the flux from the media. The output from such a head may also resemble the signal shown in FIG. 6.

The invention described here is a CPP-GMR design that would act as a differential read back sensor. A differential sensor could be made by biasing part of the sensor in region A shown in FIG. 3 and part of the sensor in region B shown in FIG. 3. This can be accomplished by providing a pair of GMR multilayers separated by a non-magnetic interlayer. The magnetizations of the GMR multilayers would be biased such that they point in opposite directions, for example, one pointing toward the media and one pointing away from the media. As such, when exposed to a magnetic field, the resistance of the GMR multilayers will vary inversely.

DESCRIPTION OF DRAWINGS

FIGS. 8(a–c) show various configurations of the SAF which can be used in place of the permanent magnet of FIG. 7(a).

DETAILED DESCRIPTION OF THE INVENTION

The sensor of the present invention consists primarily of a dual GMR multilayer wherein the two GMR multilayer structures, examples of which are well known in the art, are separated by a thin non-magnetic interlayer spacer. Thus, the GMR multilayer structures are magnetically de-coupled from each other.

Figure 7A:
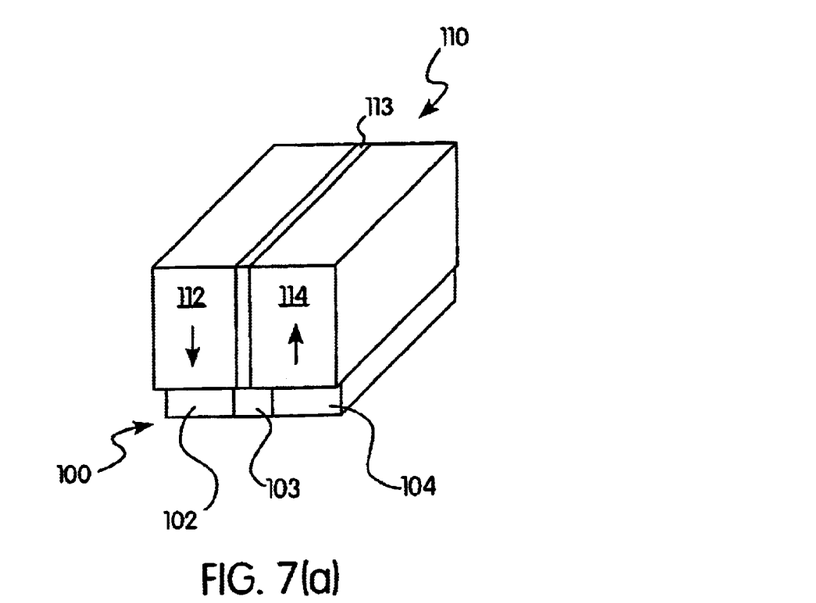
FIG. 7(a) shows one possible configuration of a differential CPP sensor using a SAF for biasing.

FIG. 7(a) shows a schematic representation of one method of creating the desired bias configuration. Sensor 100 consists of GMR multilayer structures 102 and 104, separated by non-magnetic de-coupling interlayer 103. Non-magnetic interlayer 103 would commonly be composed of one of Ta, W, Ru, Al, Au or Cu, but may be any other non-magnetic material.

In one embodiment, sensor 100 is biased using a pair of permanent magnets 112 and 14 separated by a thin layer of non-magnetic material 113. In the schematic drawing of FIG. 7(a), it can be seen that permanent magnet 12 has its magnetization pointing downward, while permanent magnet 114 has its magnetization pointing upward, such as to bias the dual multilayer structures in opposite directions. As such, when exposed to a magnetic field, the resistance of one multilayer will increase, while the resistance of the other multilayer will decrease.

Figure 7B:
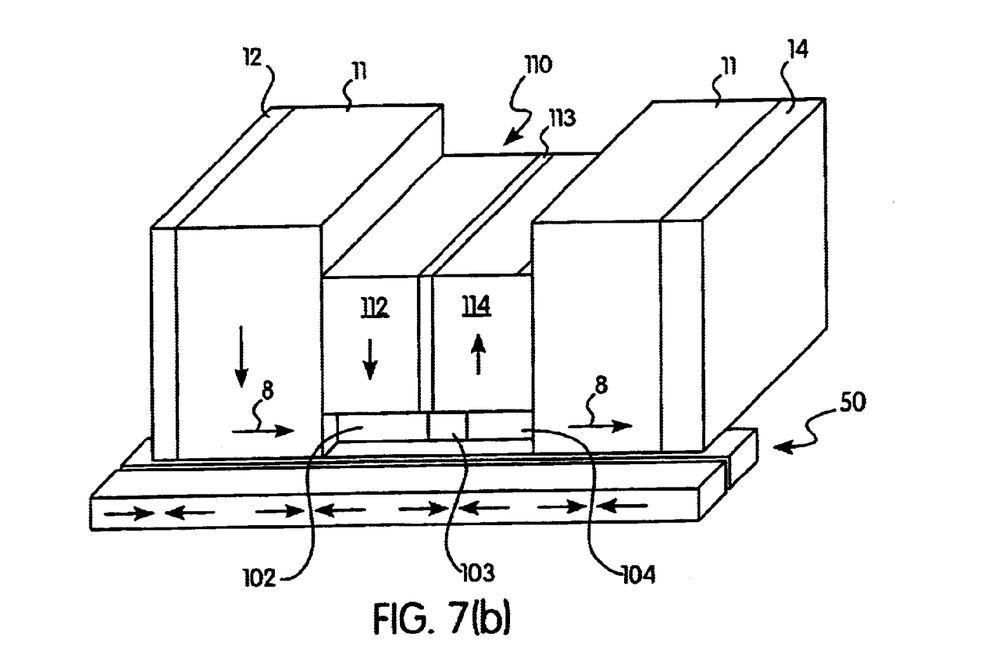
FIG. 7(b) shows the sensor of FIG. 7(a) configured as a sensor for reading a magnetic disc.

The new configuration of sensor and biasing structure 110 would replace sensor 10 (GMR) and biasing magnet 12 (PM) in the prior art sensor of FIG. 4, as shown in FIG. 7(b).

In another embodiment of the invention, the required biasing condition could be achieved by using a synthetic-antiferromagnet (SAF) 120 in place of the biasing magnet. The advantage of using a SAF over a permanent magnet for biasing is that there is more freedom in selecting the $M_R$ of the individual bias magnet layers. While high coercivity permanent magnets with an $M_R$>1000 emu/cc are difficult to find, it is easy to make a strongly coupled SAF where the individual layers have an $M_R$>1400 emu/cc (pure Co). The individual layers could have the same or different materials and same or different thickness.

Figures 8A, 8B:
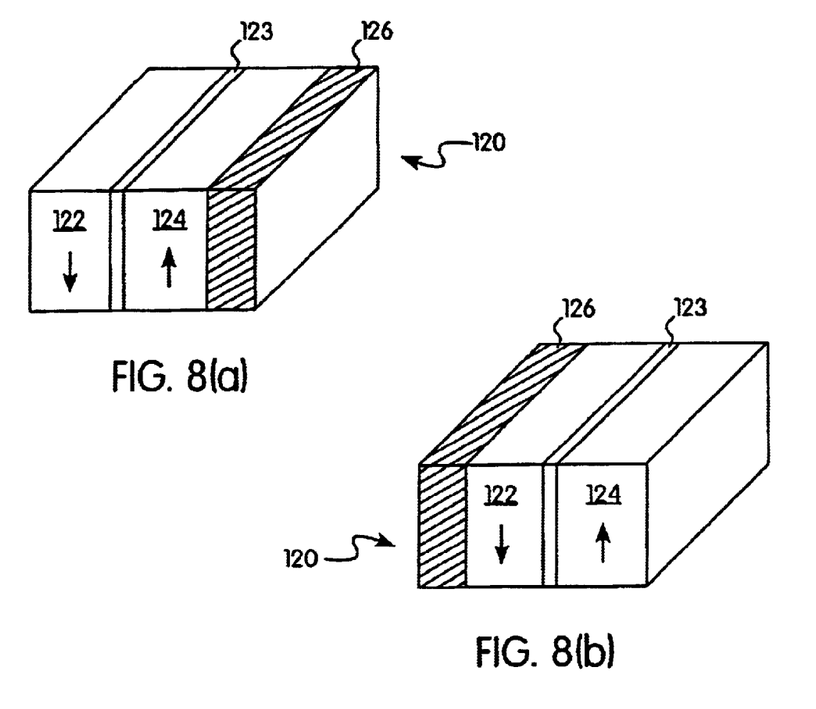
Figure 8C:
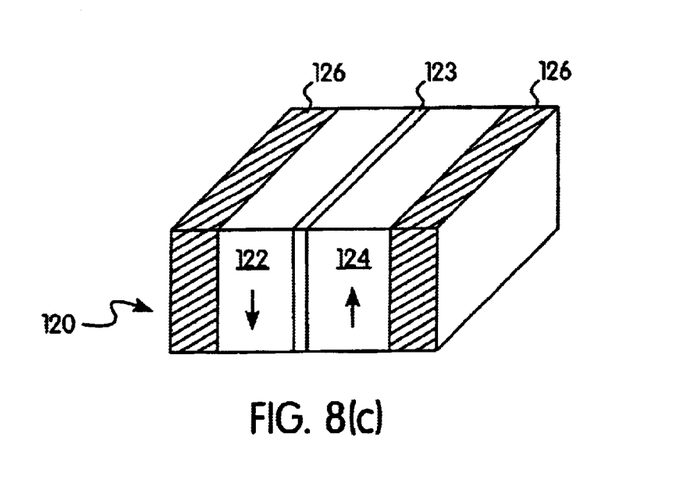

Several possible configurations for SAF 120 are shown in FIGS. 8(a–c). SAF 120 consists essentially of two layers sections of a ferromagnetic material, 122 and 124, separated by a thin layer of a non-magnetic material 123, such as ruthinium. It has been found through experimentation that the ideal thickness of layer 113 is between approximately 3 Å and 12 Å. The ferromagnetic layers could consist of Co, CoFe, CoNiFe, NiFe or alloys of these materials. The magnetic orientations of ferromagnetic layers 122 and 124 could be set or stabilized using an antiferromagnetic material or permanent magnet 126 on one or both halves of the SAF. The antiferromagnetic material could consist of PtMn, NiMn, PtPdMn, IrMn or CrPtMn and the permanent magnet could consist of CoX where X can be any combination of one or more of the following materials: Pt, Ta, Cr or B.

Figure 9:
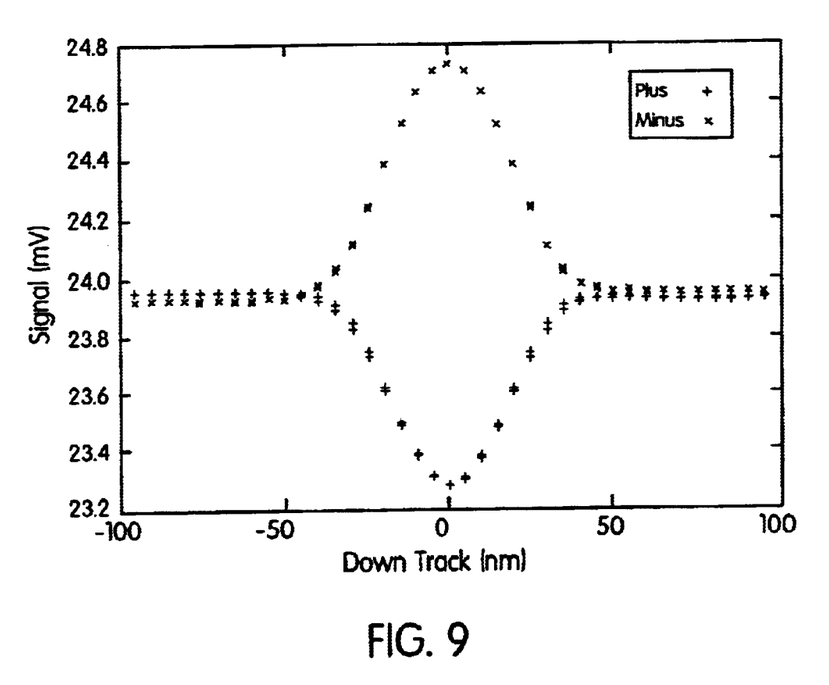
FIG. 9 shows a modeled response to a positive and negative pulse for a differential CPP sensor according to the present invention.

To show the operation of the novel differential sensor disclosed herein, a biased, shielded differential sensor was micromagnetically modeled and the signal output from an isolated transition is shown in FIG. 9. As a differential sensor, only transitions between states are detected. The response to the isolated transition is shown in FIG. 9 and is, as expected, a pulse.

It has also been observed during modeling that the differential CPP sensor disclosed herein is not sensitive to the "neighborhood" effect. The "neighborhood" effect is when the head responds to a written track even when it is not directly under the sensor, but still under the shields. The "neighborhood" effect applies to perpendicular recording using media with a soft underlayer and a standard read head. It is thought to come about from flux traveling from the written track, through the shields, down through the sensor, through the soft underlayer and then returning to the written track. One possible explanation is that, because the sensor of the present invention is a differential sensor and immune to uniform fields, it is also immune to the "neighborhood effect".

While the present invention has been shown through the examples used in the specification, the invention is not meant to be limited thereby. It is possible to modify the basic designs shown herein without deviating from the contemplated invention, the scope of which is embodied in the following claims.

What is claimed is:

1. A differential CPP sensor comprising:
   a first GMR multilayer device;
   an interlayer of non-magnetic material adjacent said first GMR multilayer device;
   a second GMR multilayer device adjacent said interlayer of non-magnetic material opposite said first GMR multilayer device; and
   a biasing element for biasing said GMR multilayer devices in opposite directions;
   wherein said first and said second GMR multilayer devices each comprises one or more bi-layer devices having a layer of ferromagnetic material and a layer of non-magnetic material; and further wherein a given applied magnetic field causes the resistance of said first GMR multilayer and the resistance of said second GMR multilayer to vary inversely.

2. The differential CPP sensor of claim 1 wherein said interlayer of non-magnetic material magnetically decouples said first and second GMR multilayers.

3. The differential CPP sensor of claim 1 wherein said interlayer of non-magnetic material electrically decouples said first and second GMR multilayers.

4. The differential CPP sensor of claim 1 wherein said interlayer of non-magnetic material is composed of a material selected from a group comprising Ta, W, Ru, Al, Au and Cu.

5. The differential CPP sensor of claim 1 wherein said biasing element comprises:
   a first permanent magnet adjacent said first GMR multilayer device, said first permanent magnet having its magnetization oriented in a first direction toward said first GMR multilayer device;
   a layer of non-magnetic material adjacent said first permanent magnet; and
   a second permanent magnet adjacent said layer of non-magnetic material and adjacent said second GMR multilayer device, said second permanent magnet having a magnetization oriented in a second direction opposite said first direction and away from said second GMR multilayer device.

6. The differential CPP sensor of claim 5 wherein said first and said second permanent magnets are composed of a material selected from a group comprising CoPt, CoTa, CoCr and CoB.

7. The differential CPP sensor of claim 1 wherein said ferromagnetic layers in adjacent bi-layers in each of said GMR multilayer devices are biased orthogonal to each other and wherein said orthogonal biasing of said first GMR device is opposite said orthogonal biasing of said second GMR device.

8. A differential CPP sensor comprising:
a first GMR multilayer device;
an interlayer of non-magnetic material adjacent said first GMR multilayer device;
a second GMR multilayer device adjacent said interlayer of non-magnetic material opposite said first GMR multilayer device; and
a synthetic anti-ferromagnet for biasing said GMR multilayer devices in opposite directions;
wherein a given applied magnetic field causes the resistance of said first GMR multilayer and the resistance of said second GMR multilayer to vary inversely.

9. The differential CPP sensor of claim 8 wherein said synthetic anti-ferromagnet comprises:
a first layer of ferromagnetic material adjacent said first GMR multilayer device;
a layer of non-magnetic material adjacent said first layer of ferromagnetic material; and
a second layer of ferromagnetic material adjacent said layer of non-magnetic material opposite said first layer of ferromagnetic material and adjacent said second GMR multilayer device.

10. The differential CPP sensor of claim 9 wherein said first and said second layers of ferromagnetic material are composed of a material selected from a group comprising Co, CoFe, CoNiFe, NiFe and CoFeB.

11. The differential CPP sensor of claim 9 wherein said layer of non-magnetic material is composed of a material selected from a group comprising PtMn, PtPdMn, IrMn and CrPtMn.

12. The differential CPP sensor of claim 9 wherein said layer of non-magnetic material is relatively thin with respect to said first and said second layers of ferromagnetic material.

13. The differential CPP sensor of claim 12 wherein said layer of non-magnetic material is between approximately two Angstroms (2 Å) and twelve Angstroms (12 Å) in thickness.

14. The differential CPP sensor of claim 9 further comprising a stabilizing layer adjacent said first layer of ferromagnetic material opposite said layer of non-magnetic material.

15. The differential CPP sensor of claim 14 wherein said stabilizing layer is a permanent magnet.

16. The differential CPP sensor of claim 14 wherein said stabilizing layer is composed of an anti-ferromagnetic material.

17. The differential CPP sensor of claim 9 further comprising a stabilizing layer adjacent said second layer of ferromagnetic material opposite said layer of non-magnetic material.

18. The differential CPP sensor of claim 17 wherein said stabilizing layer is a permanent magnet.

19. The differential CPP sensor of claim 17 wherein said stabilizing layer is composed of an anti-ferromagnetic material.

20. The differential CPP sensor of claim 9 further comprising:
a first stabilizing layer adjacent said first layer of ferromagnetic material opposite said layer of non-magnetic material; and
a second stabilizing layer adjacent said second layer of ferromagnetic material opposite said layer of non-magnetic material.

21. The differential CPP sensor of claim 20 wherein said first and said second stabilizing layers are selected from a group comprising a permanent magnet and a layer of anti-ferromagnetic material.

22. A disc drive system comprising:
a magnetic media;
a write head for writing data on said magnetic media; and
a differential read head comprising:
a first GMR multilayer device;
an interlayer of non-magnetic material adjacent said first GMR multilayer device;
a second GMR multilayer device adjacent said interlayer of non-magnetic material opposite said first GMR multilayer device; and
a biasing element for biasing said GMR multilayer devices in opposite directions;
wherein said first and said second GMR multilayer devices each comprises one or more bi-layer devices having a layer of ferromagnetic material and a layer of non-magnetic material and further wherein a given applied magnetic field causes the resistance of said first GMR multilayer and the resistance of said second GMR multilayer to vary inversely.

23. The disc drive system of claim 22 wherein said biasing element is a synthetic anti-ferromagnet comprising:
a first layer of ferromagnetic material adjacent said first GMR multilayer device;
a layer of non-magnetic material adjacent said first layer of ferromagnetic material; and
a second layer of ferromagnetic material adjacent said layer of non-magnetic material opposite said first layer of ferromagnetic material and adjacent said second GMR multilayer device.

24. The disk drive system of claim 23 wherein said synthetic anti-ferromagnet further comprises:
one or more stabilizing layers selected from a group comprising a permanent magnet and a layer of anti-ferromagnetic material.

25. The disc drive system of claim 24 wherein said one or more stabilizing layers are located adjacent said layers of ferromagnetic material opposite said layer of non-magnetic material.

26. The disk drive system of claim 20 wherein adjacent bi-layers in each of said GMR multilayer devices are biased orthogonal to each other and wherein said orthogonal biasing of said first GMR device is opposite said orthogonal biasing of said second GMR device.

* * * * *